United States Patent
Ota et al.

(10) Patent No.: US 10,276,609 B2
(45) Date of Patent: Apr. 30, 2019

(54) SEMICONDUCTOR DEVICE AND INFORMATION PROCESSING SYSTEM

(71) Applicant: CANON KABUSHIKI KAISHA, Tokyo (JP)

(72) Inventors: Keisuke Ota, Tokyo (JP); Hajime Ikeda, Yokohama (JP); Tatsuhito Goden, Machida (JP); Yoichi Wada, Yokohama (JP); Toshinori Hasegawa, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 131 days.

(21) Appl. No.: 15/407,373

(22) Filed: Jan. 17, 2017

(65) Prior Publication Data
US 2017/0213859 A1    Jul. 27, 2017

(30) Foreign Application Priority Data

Jan. 25, 2016 (JP) .................. 2016-011882

(51) Int. Cl.
| | |
|---|---|
| *H01L 27/144* | (2006.01) |
| *H01L 27/146* | (2006.01) |
| *G01S 17/08* | (2006.01) |
| *G01S 7/481* | (2006.01) |
| *H01L 31/16* | (2006.01) |
| *H01L 31/167* | (2006.01) |

(52) U.S. Cl.
CPC ........ *H01L 27/1443* (2013.01); *G01S 7/4816* (2013.01); *G01S 17/08* (2013.01); *H01L 27/1461* (2013.01); *H01L 27/14607* (2013.01); *H01L 27/14641* (2013.01); *H01L 31/165* (2013.01); *H01L 31/167* (2013.01)

(58) Field of Classification Search
CPC ................. H01L 27/1443; H01L 31/0725
See application file for complete search history.

(56) References Cited

U.S. PATENT DOCUMENTS

| | | | |
|---|---|---|---|
| 5,130,776 A * | 7/1992 | Popovic | H01L 31/02019 257/461 |
| 7,238,973 B2 | 7/2007 | Notsu et al. | 257/190 |
| 8,482,646 B2 | 7/2013 | Watanabe et al. | 348/308 |
| 8,670,059 B2 | 3/2014 | Ikeda et al. | 348/302 |
| 2007/0103748 A1 | 5/2007 | Hashimoto et al. | 359/15 |

FOREIGN PATENT DOCUMENTS

| | | |
|---|---|---|
| JP | 2000-260972 | 9/2000 |
| JP | 2005-303268 | 10/2005 |
| JP | 2008-245217 | 10/2008 |

* cited by examiner

*Primary Examiner* — Thanh Luu
(74) *Attorney, Agent, or Firm* — Venable LLP

(57) ABSTRACT

A semiconductor device is provided. The device generates a signal based on both a first carrier generated in a first photodiode and a second carrier generated in a second photodiode. The first photodiode includes a first region of a second conductivity type and a second region of a first conductivity type arranged between a surface of a substrate and the first region. The second photodiode includes a third region of the first conductivity type and a fourth region of the second conductivity type arranged between the surface and the third region. A fifth region of the first conductivity type is provided at a position farther apart from the surface than the first region. A peak of an impurity concentration of the third region is positioned in a range where the first region exists between the second region and the fifth region.

20 Claims, 6 Drawing Sheets

SEMICONDUCTOR DEVICE AND INFORMATION PROCESSING SYSTEM

BACKGROUND OF THE INVENTION

Field of the Invention

The present invention relates to a semiconductor device and an information processing system.

Description of the Related Art

As one of distance measurement methods, there is a TOF (Time Of Flight) method of performing distance measurement by irradiating a target object to undergo distance measurement with light from a light source and detecting the light reflected from the target object. In the TOF method, a distance to the target object is calculated based on the relationship between the speed of light and a time from irradiation with light to reception of the reflected light. Note that light (ambient light) caused by a light source different from a light source for distance measurement, such as natural light or artificial light, is superimposed on the reflected light. The influence of the ambient light needs to be suppressed in order to increase the accuracy of distance measurement.

A second embodiment of Japanese Patent Laid-Open No. 2005-303268 exemplifies a semiconductor device which includes the first photosensitive unit having a structure suitable for extracting holes and the second photosensitive unit having a structure suitable for extracting electrons. The holes generated in the first photosensitive unit by ambient light when a light source is turned off are held in a hole holding unit. The electrons generated in the second photosensitive unit by reflected light and the ambient light when the light source is turned on are held in an electron holding unit. The holes held in the hole holding unit and the electrons held in the electron holding unit are recombined in a recombining unit, a carrier generated by the ambient light is removed, and a remaining carrier is obtained as a carrier generated by the reflected light.

SUMMARY OF THE INVENTION

In order to remove a carrier generated by ambient light, it is necessary to suppress differences, between the first photosensitive unit and the second photosensitive unit, in sensitivity to incident light and the number of carriers generated by the ambient light. If the difference in the number of carriers generated by the ambient light is large, the accuracy of a signal obtained by a remaining carrier may decrease. In Japanese Patent Laid-Open No. 2005-303268, an examination of the sensitivity of each photosensitive unit is not made sufficiently.

Some embodiments of the present invention provide a technique of improving the accuracy of a signal generated based on electrons and holes in a semiconductor device.

According to some embodiments, a semiconductor device comprising a first photodiode and a second photodiode arranged in a semiconductor substrate, and wherein a detection unit which includes the first photodiode and the second photodiode is configured to generate a signal based on both a first carrier which is one of electrons and holes generated in the first photodiode, and a second carrier which is the other of electrons and holes generated in the second photodiode, wherein the first photodiode and the second photodiode are arranged at different positions in a first direction along an upper surface of the semiconductor substrate, and assuming that a semiconductor region in which the first carrier is a majority carrier and the second carrier is a minority carrier is of a first conductivity type, and a semiconductor region in which the second carrier is a majority carrier and the first carrier is a minority carrier is of a second conductivity type, the first photodiode includes a first semiconductor region of the second conductivity type, and a second semiconductor region of the first conductivity type arranged between the upper surface and the first semiconductor region in a second direction perpendicular to the upper surface, the second photodiode includes a third semiconductor region of the first conductivity type, and a fourth semiconductor region of the second conductivity type arranged between the upper surface and the third semiconductor region in the second direction, a fifth semiconductor region of the first conductivity type is provided at a position farther apart from the upper surface than the first semiconductor region, and in the second direction, a peak of an impurity concentration of the third semiconductor region is positioned in a depth range corresponding to a depth range where the first semiconductor region exists between the second semiconductor region and the fifth semiconductor region, is provided.

According to some other embodiments, an information processing system comprising: a semiconductor device; and a processing unit configured to process a signal output from the semiconductor device, wherein the semiconductor device comprises a first photodiode and a second photodiode arranged in a semiconductor substrate, and a detection unit which includes the first photodiode and the second photodiode is configured to generate a signal based on both a first carrier which is one of electrons and holes generated in the first photodiode, and a second carrier which is the other of electrons and holes generated in the second photodiode, wherein the first photodiode and the second photodiode are arranged at different positions in a first direction along an upper surface of the semiconductor substrate, and assuming that a semiconductor region in which the first carrier is a majority carrier and the second carrier is a minority carrier is of a first conductivity type, and a semiconductor region in which the second carrier is a majority carrier and the first carrier is a minority carrier is of a second conductivity type, the first photodiode includes a first semiconductor region of the second conductivity type, and a second semiconductor region of the first conductivity type arranged between the upper surface and the first semiconductor region in a second direction perpendicular to the upper surface, the second photodiode includes a third semiconductor region of the first conductivity type, and a fourth semiconductor region of the second conductivity type arranged between the upper surface and the third semiconductor region in the second direction, a fifth semiconductor region of the first conductivity type is provided at a position farther apart from the upper surface than the first semiconductor region, and in the second direction, a peak of an impurity concentration of the third semiconductor region is positioned in a depth range corresponding to a depth range where the first semiconductor region exists between the second semiconductor region and the fifth semiconductor region, is provided.

Further features of the present invention will become apparent from the following description of exemplary embodiments (with reference to the attached drawings).

DESCRIPTION OF THE EMBODIMENTS

Figure 1:
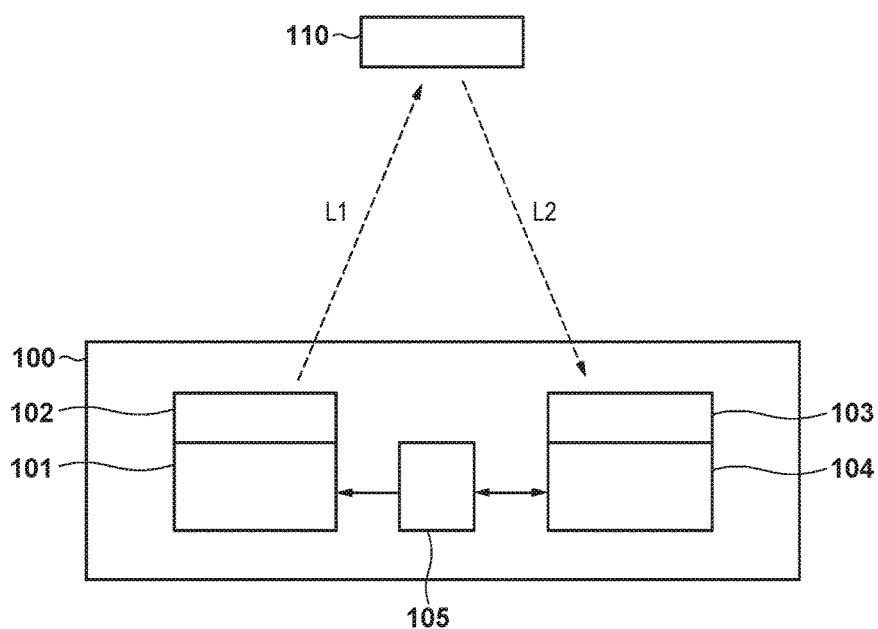
FIG. 1 is a view showing an example of the arrangement of an information processing system using a semiconductor device according to the present invention.

A practical embodiment of a semiconductor device of the present invention will be described below with reference to the accompanying drawings. Note that in a description and the drawings below, common reference numerals denote common arrangements throughout the plurality of drawings. Therefore, the common arrangements will be described by referring to the plurality of drawings mutually and descriptions of the arrangements denoted by the common reference numerals will be omitted as needed.

FIG. 1 is a view for explaining an example of the arrangement of an information processing system 100 to which a semiconductor device according to the present invention is applied. The information processing system 100 includes, for example, a light source 101 such as an LED, optical systems 102 and 103 such as lenses, a detection device 104, and a processing unit 105.

A target object 110 as a target of distance measurement is irradiated with light L1 emitted from the light source 101 via the optical system 102. Light L2 includes light reflected from the target object 110 and enters the detection device 104 via the optical system 103. The detection device 104 supplies a signal based on the light L2 to the processing unit 105. The detection device 104 may correspond to the semiconductor device according to the present invention and may be referred to as a photoelectric conversion apparatus, a photoelectric conversion device, or the like. The processing unit 105 drives the light source 101 and the detection device 104, and calculates a distance to the target object 110 based on the signal from the detection device 104 (a concrete method of the calculation will be described later). Note that the arrangement of the information processing system 100 is not limited to the arrangement in this embodiment. In accordance with a purpose or the like, this arrangement may partially be changed, or another element may be added in association. For example, the information processing system 100 can be a distance measurement system. Furthermore, for example, the information processing system 100 can be an image capturing system, and the detection device 104 can also function as an image capturing unit.

Figure 2:
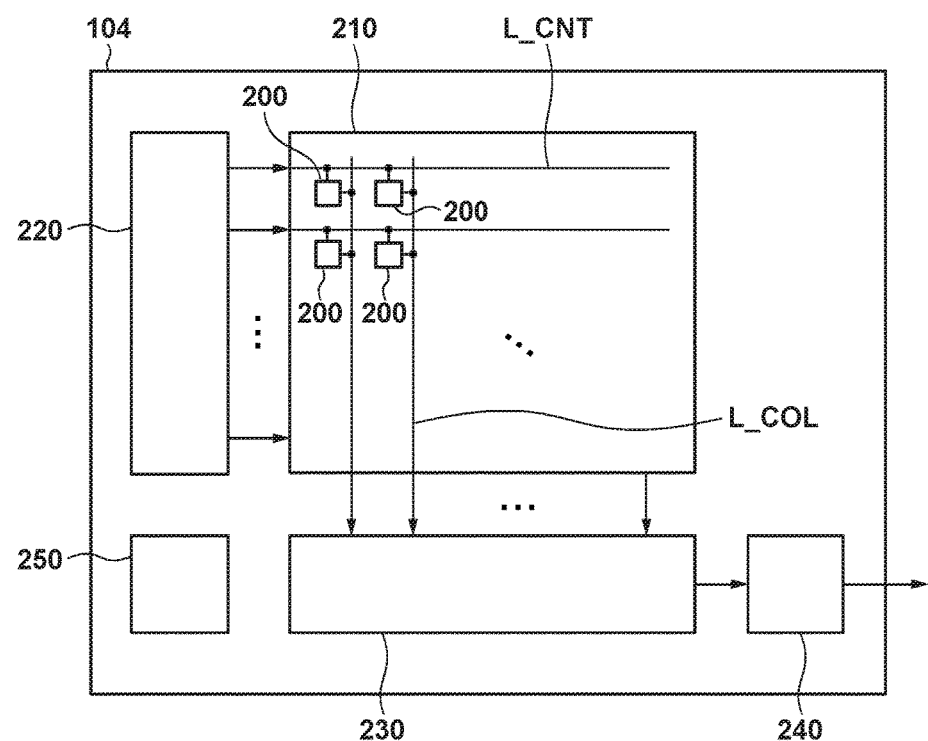
FIG. 2 is a view showing an example of the arrangement of a detection device of the information processing system in FIG. 1.

FIG. 2 is a view for explaining an example of the arrangement of the detection device 104. The detection device 104 includes an array unit 210, a driving unit 220, a readout unit 230, an output unit 240, and a control unit 250. The array unit 210 includes a plurality of detection units 200 on a semiconductor substrate. The respective detection units 200 can be arrayed in an array (so as to form a plurality of rows and a plurality of columns). The driving unit 220 drives, for example, the respective detection units 200 of the array unit 210 for each row by using a control line L_CNT arranged in each row. Each of the driven detection units 200 outputs the signal based on the light L2 via a corresponding column signal line L_COL. The readout unit 230 horizontally transfers the signal output from each column signal line L_COL, and the output unit 240 outputs the horizontally transferred signal to the aforementioned processing unit 105. The control unit 250 controls the above-described respective units based on a reference signal such as a clock signal. The detection device 104 may further include, for example, a power supply unit (not shown) which supplies power to at least one of the driving unit 220, the readout unit 230, the output unit 240, and the control unit 250.

Figure 3:
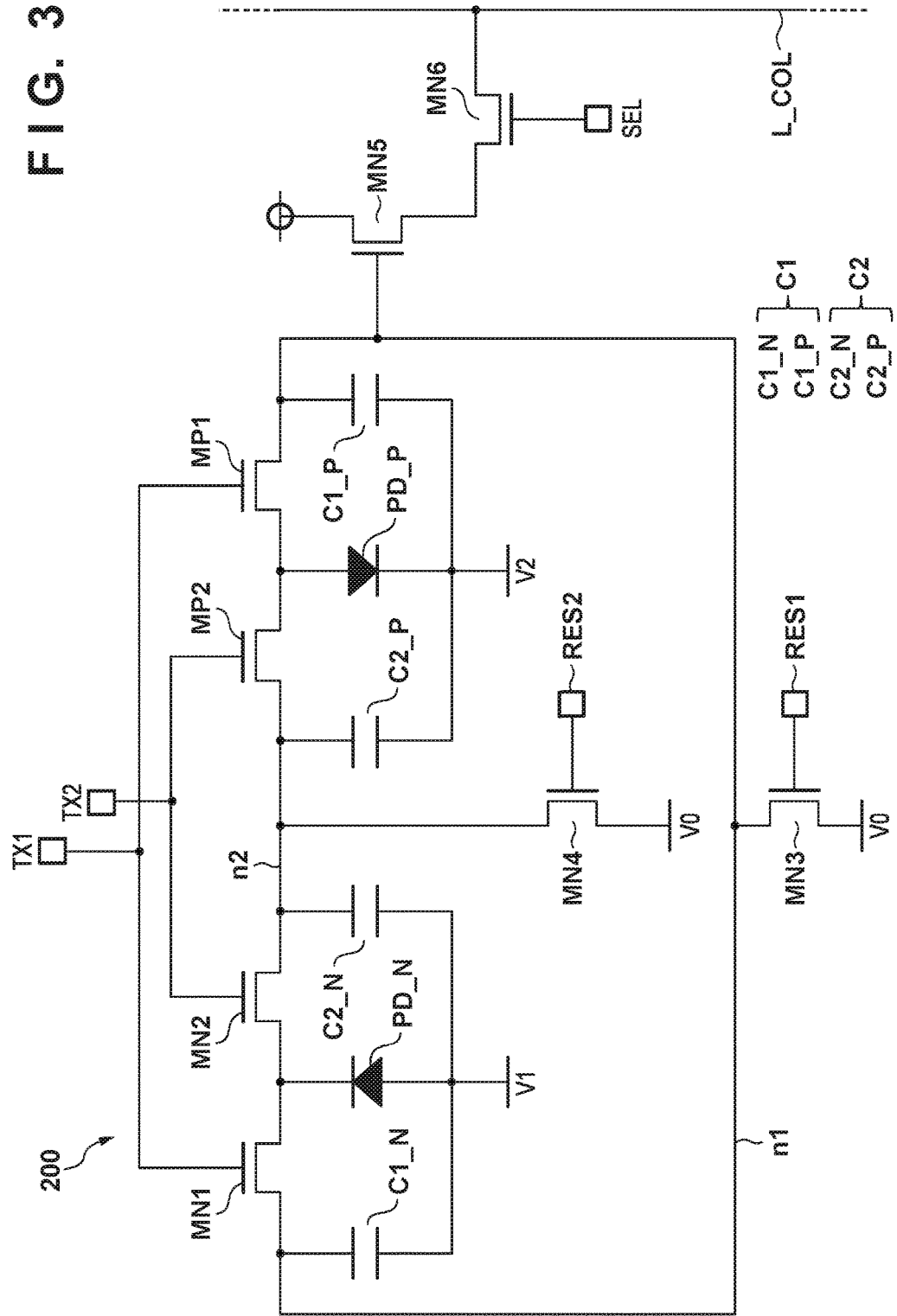
FIG. 3 is a view showing an example of the arrangement of a detection unit of the information processing system in FIG. 1.

FIG. 3 is a view for explaining an example of the arrangement of the detection unit 200. The detection unit 200 includes, for example, photodiodes PD_N and PD_P, transfer units MN1 to MN6, and MP1 and MP2, and capacitors C1_N, C2_N, C1_P, and C2_P.

The photodiode PD_N is a photodiode which accumulates, out of electrons and holes generated by incident light, the electrons serving as a majority carrier of an n-type semiconductor. The photodiode PD_P is a photodiode which accumulates, out of the electrons and the holes generated by the incident light, the holes serving as a majority carrier of a p-type semiconductor. The photodiode PD_N may be expressed as a photoelectric conversion unit (first photoelectric conversion unit). The same also applies to the other photodiode PD_P, and the photodiode PD_P may be expressed as, for example, a second photoelectric conversion unit.

Each of the transfer units MN1 to MN6, and MP1 and MP2 has a MIS gate structure. That is, each of the transfer units MN1 to MN6, and MP1 and MP2 has a stacked structure of a semiconductor region (channel region), a gate insulating film, and a gate electrode. Accordingly, each of the transfer units MN1 to MN6, and MP1 and MP2 can also be referred to as a transfer gate. For each of the transfer units MN1 to MN6, an n-type channel is formed in the semiconductor region by inversion in an ON state (conductive state). For each of the transfer units MP1 and MP2, a p-type channel is formed in the semiconductor region by inversion in the ON state. Thus, the transfer units MN1 to MN6, and the transfer units MP1 and MP2 are different in conductivity type.

The transfer unit MN1 is arranged so as to form a current path between the cathode of the photodiode PD_N and a detection node n1. The anode of the photodiode PD_N is fixed to a potential V1. That is, the anode of the photodiode PD_N is connected to a power supply line of a potential supply unit which supplies the potential V1. The transfer unit MP1 is arranged so as to form a current path between the anode of the photodiode PD_P and the detection node n1. The cathode of the photodiode PD_P is fixed to a potential V2. That is, the cathode of the photodiode PD_P is connected to a power supply line of a potential supply unit which supplies the potential V2.

The transfer unit MN2 is arranged so as to form a current path between the cathode of the photodiode PD_N and a detection node n2. The transfer unit MP2 is arranged so as to form a current path between the anode of the photodiode PD_P and the detection node n2.

The capacitors C1_N and C2_N can be made of a p-type semiconductor region and an n-type semiconductor region arranged therein (details of which will be described later). One terminal of the capacitor C1_N is connected to the detection node n1, and the other terminal of the capacitor C1_N is fixed to the potential V1. One terminal of the capacitor C2_N is connected to the detection node n2, and the other terminal of the capacitor C2_N is fixed to the potential V1. The capacitors C1_P and C2_P can be made of an n-type semiconductor region and a p-type semiconductor region arranged therein (details of which will be described later). One terminal of the capacitor C1_P is connected to the detection node n1, and the other terminal of the capacitor C1_P is fixed to the potential V2. One terminal of the capacitor C2_P is connected to the detection node n2, and the other terminal of the capacitor C2_P is fixed to the potential V2.

The capacitor C1_N and the capacitor C1_P can structurally be distinguished from each other, and are thus shown separately here. However, both of them are fixed to a constant potential on a side opposite to the side of the detection node n1. Therefore, they may be combined and regarded as an equivalent single capacitive component. The capacitor C1_N holds electrons generated by photoelectric conversion in the photodiode PD_N. The capacitor C1_P holds holes generated by photoelectric conversion in the photodiode PD_P. A capacitor C1 serving as a capacitor obtained by combining the capacitor C1_N and the capacitor C1_P holds the charge amount of a carrier corresponding to the difference between the charges and the holes. A potential difference (voltage) based on the charge amount/capacitance is generated in the capacitor C1. Therefore, the capacitor C1_N, the capacitor C1_P, or the capacitor C1 obtained by combining them holds a potential corresponding to charges of a carrier from a photodiode and, in other words, functions as a charge-voltage conversion unit which converts the charges into the voltage. Similarly, the capacitor C2_N, the capacitor C2_P, and a capacitor C2 obtained by combining them can also be used as charge-voltage conversion units.

Let Vn be the potential of the detection node n1. When the electrons generated in the photodiode PD_N are transferred from the cathode of the photodiode PD_N to the capacitor C1_N via the transfer unit MN1, the potential V1<the potential Vn may hold to facilitate transfer. Similarly, when the holes generated in the photodiode PD_P are transferred from the anode of the photodiode PD_P to the capacitor C1_P via the transfer unit MP1, the potential V2>the potential Vn may hold to facilitate transfer. As a result, the potential V1<the potential V2 may hold. As described above, the fact that the potential V1 and the potential V2 are different from each other, and the potential V2 is higher than the potential V1 (the potential V1<the potential V2) has an advantage over the fact that the potential V2 is equal to or lower than the potential V1 (the potential V1≥the potential V2) in increasing a measurement distance accuracy. That is because this makes it possible to increase collection efficiency of charges, and obtain a signal with a high-speed operation and a high accuracy. Practically, the potential difference between the potential V1 and the potential V2 may be equal to or higher than 0.10 V. The potential difference between the potential V1 and the potential V2 is typically from 1 V (inclusive) to 5 V (inclusive). It is also possible to set the potential V1 lower than a ground potential GND (0 V) (the potential V1<the ground potential GND) and set the potential V2 higher than the ground potential GND (0 V) (the ground potential GND<the potential V2). That is, the ground potential may be between the potential V1 and the potential V2, the potential V1 may be a negative potential, and the potential V2 may be a positive potential. In this embodiment, the potential V1 can be set to about −2 [V], and the potential V2 can be set to about +2 [V].

A control signal TX1 is supplied to the gate electrodes of the transfer units MN1 and MP1 via the control line L_CNT. For example, the transfer unit MN1 is set in the ON state (conductive state) and, on the other hand, the transfer unit MP1 is set in an OFF state (non-conductive state) when the signal TX1 is at high level. Further, for example, the transfer unit MN1 is set in the OFF state and, on the other hand, the transfer unit MP1 is set in the ON state when the signal TX1 is at low level. That is, the transfer unit MN1 and the transfer unit MP1 are different in conductivity type, and thus configured to perform a transfer operation alternately and complementarily. Similarly, a control signal TX2 is supplied to the gate electrodes of the transfer units MN2 and MP2 via the control line L_CNT. For example, the transfer unit MN2 is set in the ON state and, on the other hand, the transfer unit MP2 is set in the OFF state when the signal TX2 is at high level. Further, for example, the transfer unit MN2 is set in the OFF state and, on the other hand, the transfer unit MP2 is set in the ON state when the signal TX2 is at low level. That is, the transfer unit MN2 and the transfer unit MP2 are different in conductivity type, and thus configured to perform a transfer operation alternately and complementarily.

The transfer unit MN3 is arranged so as to form a current path between the detection node n1 and a power supply line having a potential V0. A control signal RES1 is supplied to the gate electrode of the transfer unit MN3 via the control line L_CNT. The transfer unit MN3 initializes the capacitors C1_N and C1_P in response to the signal RES1. Similarly, the transfer unit MN4 is arranged so as to form a current path between the detection node n2 and a power supply line having the potential V0, and initializes the capacitors C2_N and C2_P in response to a control signal RES2. In this embodiment, the potential V0 can be set to 0 [V].

In this embodiment, a mode has been exemplified in which the control signals RES1 and RES2 different from each other are supplied to the transfer units MN3 and MN4, respectively. However, for example, a common control signal may be supplied to the control signals RES1 and RES2. Furthermore, in this embodiment, a mode has been exemplified in which both of the transfer units MN3 and MN4 are fixed to the potential V0. However, they may be fixed to different potentials.

The transfer unit MN5 performs a source follower operation in accordance with the potential of the detection node n1. In response to a control signal SEL supplied via the control line L_CNT, the transfer unit MN6 outputs a signal corresponding to the potential of the source of the transfer unit MN5 to the column signal line L_COL. In this embodiment, nMOS transistors are used for the transfer units MN5 and MN6. However, pMOS transistors may be used. Each of the transfer units MN5 and MN6 may function as a circuit unit configured to output a signal generated in the detection unit 200 from the detection unit 200 and may be referred to as, for example, a signal output unit (or simply an output unit). Based on the signal output from the detection unit 200, the processing unit 105 calculates the distance between the information processing system 100 and the target object 110.

As described above, the detection unit 200 thus generates a signal based on the carriers accumulated in both of the photodiode PD_N and the photodiode PD_P. By providing the charge-voltage conversion units and the signal output units in the detection unit 200, the signal generated based on both carriers can be output from the detection unit 200 without transferring the electrons or holes to a final output unit of the semiconductor device. This makes it possible to further increase the speed of detecting the charge amount of the carrier corresponding to the electrons and holes as compared with a case in which the electrons or the holes are transferred to the final output unit of the semiconductor device. The arrangement of the detection unit 200 is not limited to the above-described embodiment, as a matter of course. A part of the arrangement can be changed appropriately as needed. In this embodiment, the arrangement has been exemplified in which each transfer unit (such as MN1) using the MIS gate structure transfers the carrier generated in the photodiode (such as PD_N) to the corresponding capacitor (such as C1_N). However, the present invention is not limited to this. For example, the photodiode (such as PD_N) and the capacitor (such as C1_N) may be connected directly without using the MIS gate structure. For example, another MIS gate structure may further be arranged between the transfer unit (such as MN1) and the capacitor (such as C1_N). That is, the capacitor (such as C1_N) can be configured to hold the carrier or a potential corresponding to it and generated and accumulated in the photodiode (such as PD_N), and to provide it to a circuit unit at the subsequent stage.

Figure 4A:
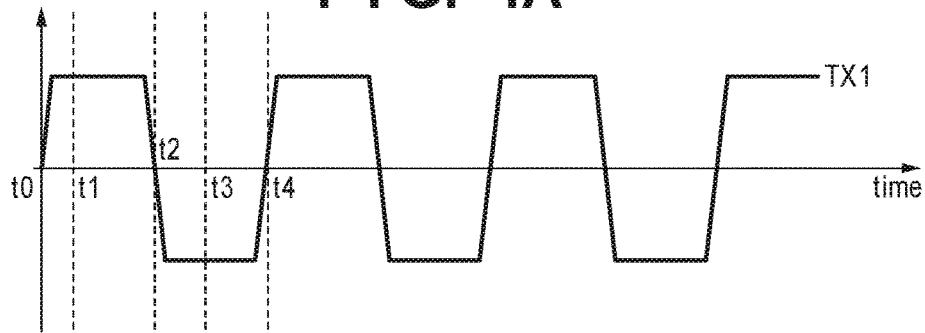
FIGS. 4A to 4D show timing charts each showing an example of a method of driving the detection unit of the information processing system in FIG. 1.
Figure 4B:
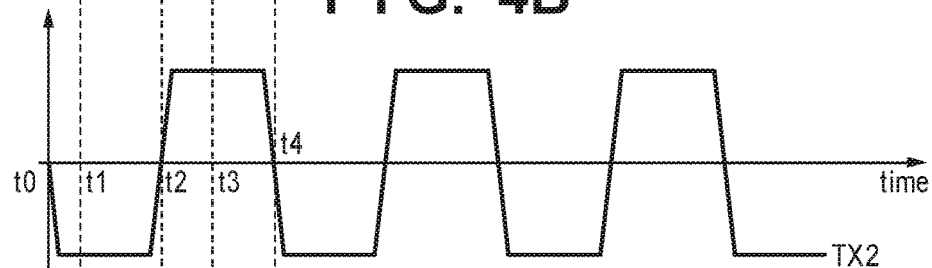

FIGS. 4A to 4D are timing charts for explaining an example of a method of driving each detection unit 200 when performing a distance measurement method based on a TOF method. Note that the abscissa indicates a time axis. FIGS. 4A and 4B show the waveforms of the control signals TX1 and TX2, respectively. The ordinate indicates a signal level. When the signal TX1 is at high level (positive potential), the transfer unit MN1 is set in the ON state, and the transfer unit MP1 is set in the OFF state. When the signal TX1 is at low level (negative potential), the transfer unit MP1 is set in the ON state, and the transfer unit MN1 is set in the OFF state. Note that when the signal TX1 is 0 [V], both of the transfer units MN1 and MP1 are set in the OFF state. The same also applies to the signal TX2. The waveforms of the signal TX1 and the signal TX2 have opposite phases. Therefore, the transfer unit MN1 and the transfer unit MN2 transfer the carriers to the corresponding capacitors at different timings. Similarly, the transfer unit MP1 and the transfer unit MP2 transfer the carriers to the corresponding capacitors at different timings.

Figure 4C:
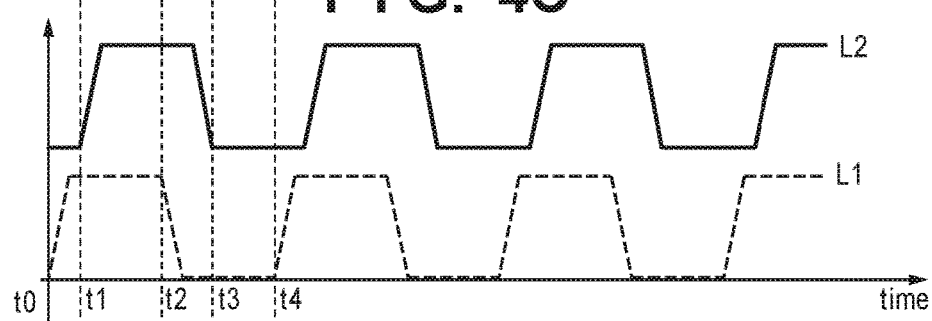

FIG. 4C shows the waveform of the amount of each of the lights L1 and L2. The ordinate indicates the light amount. As described above, the light L1 is generated by the light source 101 and as shown in FIG. 4C, repeatedly turns on and off the light source 101 in a predetermined cycle. The light L2 is received by the detection device 104 and can include not only the light reflected from the target object 110 but also ambient light as light in an external environment. Therefore, for the received light L2, low level that is not 0 and corresponds to turn-off of the light source 101, and high level which is higher than low level and corresponds to turn-on of the light source 101 are shown in FIG. 4C. A delay (phase difference) corresponding to the distance to the target object 110 occurs between the received light L2 and the light L1.

As seen in FIGS. 4A to 4C, the cycle of high level/low level of each of the signals TX1 and TX2 is synchronized with the cycle of turn-on/turn-off of the light source 101. In this embodiment, individual switching between the ON state/OFF state of the transfer units MN1 and MN2, and MP1 and MP2 which receive the signal TX1 or TX2 is performed almost simultaneously with a timing of switching between turn-on/turn-off of the light source 101.

Figure 4D:
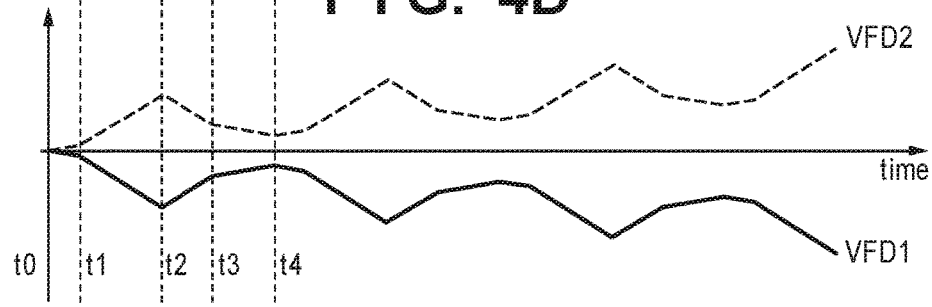

FIG. 4D shows a potential VFD1 (more specifically, the potential of the capacitor C1 obtained by combining the capacitors C1_N and C1_P) of the detection node n1 and a potential VFD2 (more specifically, the potential of the capacitor C2 obtained by combining the capacitors C2_N and C2_P) of the detection node n2. The ordinate indicates a potential value. That is, the potential VFD1 corresponds to the charge amount held in the capacitor C1 obtained by combining the capacitors C1_N and C1_P, and the potential VFD2 corresponds to the charge amount held in the capacitor C2 obtained by combining the capacitors C2_N and C2_P.

First, (before time t0), the transfer units MN3 and MN4 initialize the capacitors C1_N and C1_P, and C2_N and C2_P, that is, initialize the potentials VFD1 and VFD2. In this embodiment (V0=0 [V], V1=−2 [V], and V2=+2 [V]), the initial value of each of the potentials VFD1 and VFD2 is substantially 0 [V]. The photodiodes PD_N and PD_P are initialized by setting the transfer units MN1 and MN2, and MP1 and MP2 in the ON state. For example, the cathode potential of the photodiode PD_N after initialization becomes about −1 [V], and the anode potential of the photodiode PD_P after initialization becomes about +1 [V].

At time t0, the light source 101 is turned on. Also at time t0, the signal TX1 is set at high level, and the signal TX2 is set at low level, and the transfer units MN1 and MP2 are set in the ON state, and the transfer units MN2 and MP1 are set in the OFF state. That is, the transfer unit MN1 connects the photodiode PD_N to the capacitor C1_N, and the transfer unit MP2 connects the photodiode PD_P to the capacitor C2_P. Then, at time t1, the received light L2 is set at high level.

Note that in the period between times t0 and t1, the received light L2 is set at low level (not 0), and thus the electrons generated and accumulated in the photodiode PD_N and corresponding to the amount of the light L2 at low level are transferred to the capacitor C1_N. Similarly, the holes generated and accumulated in the photodiode PD_P and corresponding to the amount of the light L2 at low level are transferred to the capacitor C2_P. Therefore, as shown in FIG. 4D, at time t1, the potential VFD1 becomes a potential corresponding to the transferred electrons and similarly, the potential VFD2 becomes a potential corresponding to the transferred holes.

The received light L2 is set at high level at time t1. Accordingly, the amount of the electrons generated in the photodiode PD_N and the amount of the holes generated in the photodiode PD_P from time t1 (to time t2 to be described later) become larger than those in the period between times t0 and t1. That is, the change amount of each of the potentials VFD1 and VFD2 between times t1 and t2 becomes larger than that in the period between times t0 and t1.

At time t2, the light source 101 is turned off. Also at time t2, the signal TX1 is set at low level, and the signal TX2 is set at high level, and the transfer units MN1 and MP2 are set in the OFF state, and the transfer units MN2 and MP1 are set in the ON state. That is, the transfer unit MN2 connects the photodiode PD_N to the capacitor C2_N, and the transfer unit MP1 connects the photodiode PD_P to the capacitor C1_P.

Consequently, from time t2 (to time t3 to be described later), the holes generated and accumulated in the photodiode PD_P and corresponding to the amount of the light L2 at high level are transferred to the capacitor C1_P. Note that the holes transferred to the capacitor C1_P and the electrons transferred to the capacitor C1_N in the period of times t0 to t2 are recombined and disappear. Accordingly, the potential VFD1 increases. As described above, the capacitor C1_N and the capacitor C1_P correspond to the single capacitor C1. Therefore, it can also be said that the potential VFD1 increases simply by transferring the holes to the capacitor C1. Similarly, at times t2 and t3, the electrons generated and accumulated in the photodiode PD_N and corresponding to the amount of the light L2 at high level are transferred to the capacitor C2_N, decreasing the potential VFD2.

Then, the received light L2 is set at low level at time t3, and thus the amount of electrons generated in the photodiode PD_N and the amount of the holes generated in the photodiode PD_P from time t3 (to time t4 to be described later) become smaller than those in a period between times t2 and t3. That is, the change amount of each of the potentials VFD1 and VFD2 between times t3 and t4 becomes smaller than that in the period between times t2 and t3.

At time t4, again, the light source 101 is turned on and also, the signal TX1 is set at high level, and the signal TX2 is set at low level. That is, assuming times t0 to t4 as one cycle, a series of operations described above is repeated periodically from time t4. Note that a period for one cycle is about 10 [nsec] to 100 [nsec].

By repeating the series of operations described above, the potential VFD1 (VFD2) gradually shifts from the initial value (in this embodiment, 0 [V]). For example, the potential VFD1 decreases (the potential VFD2 increases) if the amount of delay of the received light L2 to the light L1 is small (letting T be a period of one cycle of the series of operations described above, if the delay amount is smaller than T/4) as in an example of FIG. 4C. In contrast, the potential VFD1 increases (the potential VFD2 decreases) if the amount of delay of the received light L2 to the light L1 is large (if the delay amount is larger than T/4). Note that if the amount of delay of the received light L2 to the light L1 is almost equal to T/4, the potential VFD1 (VFD2) substantially stays at the initial value (in this embodiment, 0 [V]). It is therefore possible to perform, based on the potential VFD1 (VFD2) after repeating the series of operations described above, distance measurement based on the TOF method.

In this embodiment, a mode has been exemplified in which the transfer units MN5 and MN6 read out a signal corresponding to the potential VFD1. However, they may read out a signal corresponding to the potential VFD2. When they read out the signal corresponding to only one of the potentials VFD1 and VFD2, the transistor, out of the transfer units MN1 to MN4, and MP1 and MP2, that is not used for the readout may not be arranged. It is also possible, for example, to read out both of the signal corresponding to the potential VFD1 and the signal corresponding to the potential VFD2, and to improve an SN ratio by using both of them.

Figures 5A, 5B, 5C, 5D:
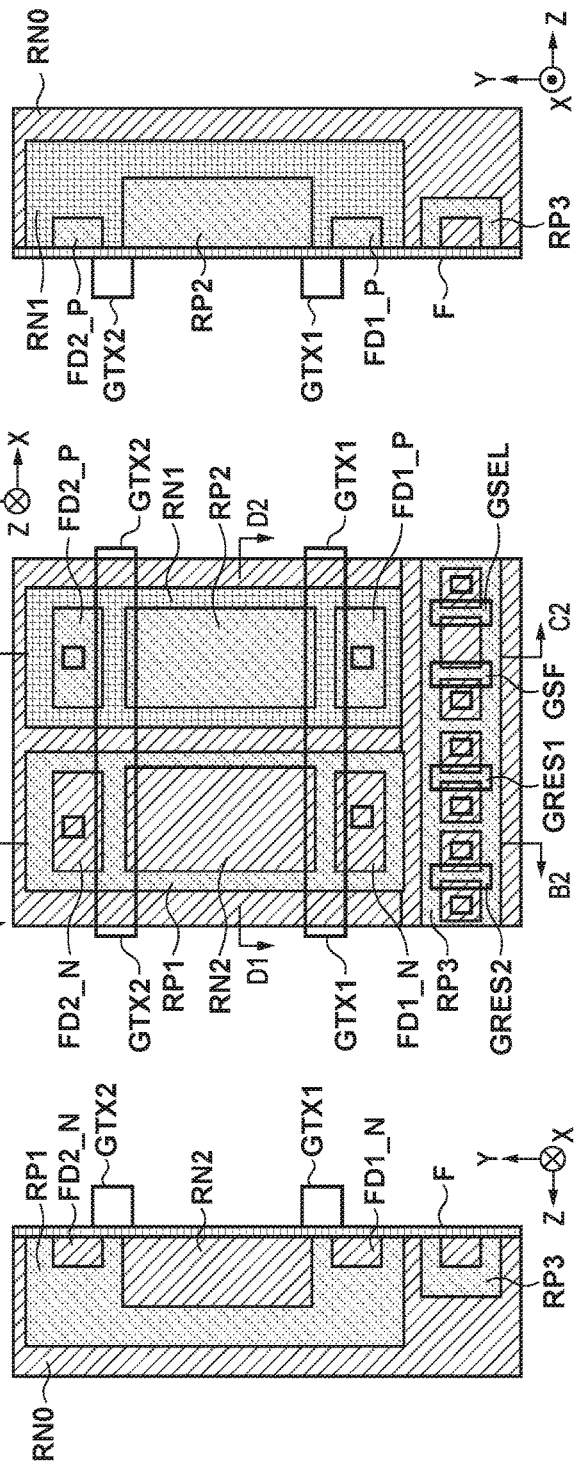
FIGS. 5A to 5D show views each showing an example of the structure of the detection unit of the information processing system in FIG. 1.

An example of the structure of the detection unit 200 will now be described with reference to FIGS. 5A to 5D. FIG. 5A is a layout view showing the detection unit 200 in a planar view (a planar view with respect to the upper surface of the semiconductor substrate or a surface parallel to it and will simply be referred to as a "planar view" hereinafter). FIG. 5B is a schematic view showing a sectional structure taken along a cut line B1-B2 of FIG. 5A. FIG. 5C is a schematic view showing a sectional structure taken along a cut line C1-C2 of FIG. 5A. FIG. 5D is a schematic view showing a sectional structure taken along a cut line D1-D2 of FIG. 5A. In FIGS. 5A to 5D, let an X direction be a direction along the upper surface of the semiconductor substrate, and let a Y direction be a direction crossing the X direction in order to facilitate the understanding of this structure. Also, let a Z direction be a depth direction of the semiconductor substrate perpendicular to the upper surface of the semiconductor substrate. A correspondence relationship in FIGS. 5A to 5D is shown by using these directions. Note that the X direction and the Y direction may correspond to the row direction and the column direction, respectively, of the aforementioned array unit 210.

The detection unit 200 is provided in an n-type semiconductor region RN0 arranged on the upper surface of the semiconductor substrate and having electrons as a majority carrier and holes as a minority carrier. The semiconductor region RN0 may be, for example, the upper surface of an n-type semiconductor substrate, or may be an n-type region formed by ion-implanting phosphorus, arsenic, antimony, or the like to the semiconductor substrate.

A p-type semiconductor region RP1 having the holes as the majority carrier and the electrons as the minority carrier and an n-type semiconductor region RN1, respectively, are arranged in the semiconductor region RN0. The photodiode PD_N, the transfer units MN1 and MN2, and the capacitors C1_N and C2_N are arranged in the semiconductor region RP1. The photodiode PD_P, the transfer units MN3 and MN4, and the capacitors C1_N and C2_N are arranged in the semiconductor region RN1.

The photodiode PD_N includes the semiconductor region RP1, and an n-type semiconductor region RN2 arranged between the semiconductor region RP1 and the upper surface of the semiconductor substrate in the Z direction. The photodiode PD_N is formed by arranging the semiconductor region RN2 in the semiconductor region RP1. At least the bottom of the semiconductor region RN2 is covered with the semiconductor region RP1. As shown in FIGS. 5A to 5D, the side surfaces of the semiconductor region RN2 may also be covered with the semiconductor region RP1. In other words, the semiconductor region RN2 may be surrounded by the semiconductor region RP1. At least the bottom of the semiconductor region RP1 serving as the bottom of the photodiode PD_N and away from the upper surface of the semiconductor substrate in the Z direction is covered with the semiconductor region RN0. That is, the semiconductor region RN0 extends under the semiconductor region RN2 along the upper surface of the semiconductor substrate, and the semiconductor region RP1 is positioned between the semiconductor region RN2 and the semiconductor region RN0.

Similarly, the photodiode PD_P includes the semiconductor region RN1, and a p-type semiconductor region RP2 arranged between the semiconductor region RN1 and the upper surface of the semiconductor substrate in the Z direction. The photodiode PD_P is formed by arranging the semiconductor region RP2 in the semiconductor region RN1. At least the bottom of the semiconductor region RP2 is covered with the semiconductor region RN1. As shown in FIGS. 5A to 5D, the side surfaces of the semiconductor region RP2 may also be covered with the semiconductor region RN1. In other words, the semiconductor region RP2 may be surrounded by the semiconductor region RN1. At least the bottom of the semiconductor region RN1 serving as the bottom of the photodiode PD_P and away from the upper surface of the semiconductor substrate in the Z direction is covered with the semiconductor region RN0. That is, the semiconductor region RN0 extends under the semiconductor region RP2 along the upper surface of the semiconductor substrate, and the semiconductor region RN1 is positioned between the semiconductor region RP2 and the semiconductor region RN0.

The semiconductor region RN2 of the photodiode PD_N and the semiconductor region RP2 of the photodiode PD_P are aligned in a direction along the upper surface of the semiconductor substrate and are arranged at different positions.

The capacitor C1_N is formed by arranging a floating diffusion region FD1_N as the n-type semiconductor region in the semiconductor region RP1. Similarly, the capacitor C2_N is formed by arranging a floating diffusion region FD2_N as the n-type semiconductor region in the semiconductor region RP1. The semiconductor region RP1, and the floating diffusion regions FD1_N and FD2_N form a p-n junction. An electrode GTX1 corresponding to the gate electrode of the transfer unit MN1 is arranged between the floating diffusion region FD1_N and the semiconductor region RN2 in the planar view, and on an insulating film F on the semiconductor substrate. Similarly, an electrode GTX2 corresponding to the gate electrode of the transfer unit MN2 is arranged between the floating diffusion region FD2_N and the semiconductor region RN2 in the planar view, and on the insulating film F on the semiconductor substrate.

Similarly, the capacitor C1_P is formed by arranging a floating diffusion region FD1_P as the p-type semiconductor region in the semiconductor region RN1. Similarly, the capacitor C2_P is formed by arranging a floating diffusion region FD2_P as the p-type semiconductor region in the semiconductor region RN1. The semiconductor region RN1, and the floating diffusion regions FD1_P and FD2_P form a p-n junction. The floating diffusion region FD1_N and the floating diffusion region FD1_P are electrically connected to the common detection node n1, as described above. Similarly, the floating diffusion region FD2_N and the floating diffusion region FD2_P are electrically connected to the common detection node n2, as described above. The electrode GTX1 corresponds not only to the gate electrode of the transfer unit MN1 but also to the gate electrode of the transfer unit MP1. That is, the electrode GTX1 forms the gate electrode of the transfer unit MN1 and the gate electrode of the transfer unit MP1 in common. Similarly, the electrode GTX2 also corresponds to the gate electrode of the transfer unit MP2. Note that the electrode GTX1 (GTX2) may not be formed in common, but electrodes corresponding to the transfer units MN1 and MP1 (MN2 and MP2) individually may be formed separately.

A p-type semiconductor region RP3 is arranged at a position away from the semiconductor region RP1 and the semiconductor region RN1 in the Y direction. Elements and portions corresponding to the transfer units MN3 and MN6 are individually arranged in the semiconductor region RP3. Electrodes GRES1, GRES2, GSF, and GSEL, respectively, shown in FIG. 5A correspond to the gate electrodes of the transfer units MN3, MN4, MN5, and MN6.

The semiconductor region RP3 shown in FIGS. 5B and 5C corresponds to the p-type wells of the transfer units MN3 and MN6. In this embodiment, a mode will be described in which the semiconductor region RP1 and the semiconductor region RP3 are separated by the semiconductor region RN0 and independent of each other. However, the present invention is not limited to this. For example, the semiconductor region RP1 and the semiconductor region RP3 may be formed integrally. The semiconductor regions RN2 and RP2 are arranged on the upper surface of the semiconductor substrate. However, the p-type semiconductor region may be arranged on the upper surface of the semiconductor substrate in the semiconductor region RN2, and the n-type semiconductor region may be arranged on the upper surface of the semiconductor substrate in the semiconductor region RP2. A dark current can be reduced by using a buried photodiode.

An effect of this embodiment will be described here. The electrons generated and accumulated in the photodiode PD_N, and the holes generated and accumulated in the photodiode PD_P are recombined to suppress the influence of the ambient light, and distance measurement based on the TOF method is performed on the potential VFD1 (VFD2) generated by the remaining carrier. In this case, the difference between the sensitivity to generate the carrier in the photodiode PD_N and the sensitivity to generate the carrier in the photodiode PD_P needs to be small regardless of the wavelength of incident light. If the sensitivity is different between the photodiode PD_N and the photodiode PD_P, many carriers generated by ambient light may remain even if the carriers are recombined. Consequently, the influence by the ambient light may be suppressed insufficiently, decreasing the accuracy of distance measurement. In order to suppress the influence by the ambient light, for example, if the photodiode PD_N and the photodiode PD_P are equal in area in the planar view, a sensitivity difference between the respective diodes per unit area may become small. Alternatively, for example, the photodiode PD_N and the photodiode PD_P may be equal in sensitivity.

Even if the semiconductor region RN1 shown in FIGS. 5A to 5D is not arranged, the photodiode PD_P can be formed by the semiconductor region RN0 and the semiconductor region RP2. However, if the photodiode PD_P is formed by the semiconductor region RN0 and the semiconductor region RP2, a carrier generated in a deep region (a lower region shown in FIG. 5D) of the semiconductor region RN0 can move by a drift and be accumulated in the semiconductor region RP2. Ambient light, typified by sunlight, includes light with various wavelengths and is absorbed into the semiconductor region RN0 in accordance with the wavelengths, and a depth in the Z direction in which the carrier is generated changes. This makes it difficult to clearly define the depth of the photodiode PD_P as a photoelectric conversion element. It is therefore difficult to control a sensitivity difference between the photodiode PD_N and the photodiode PD_P.

To cope with this, in this embodiment, the semiconductor region RN1 is arranged between the semiconductor region RN0 and the semiconductor region RP2. In the arrangement shown in FIGS. 5A to 5D, the semiconductor region RN1 is arranged in the semiconductor region RN0, and the semiconductor region RP2 which forms an accumulation region of the photodiode PD_P is arranged in the semiconductor region RN1. It is possible to form a potential barrier in a depth direction by the impurity concentration distribution of the semiconductor region RN1. This potential barrier can restrain the carrier generated at the deep position of the semiconductor region RN0 from flowing into the semiconductor region RP2 which forms the accumulation region of the photodiode PD_P. This makes it possible to make the depth of the photodiode PD_P clearer.

Note that the peak of the impurity concentration of the semiconductor region RN1 may be positioned, in the depth direction (Z direction), in a depth range where the semiconductor region RP1 exists between the semiconductor region RN2 and the semiconductor region RN0. In this case, as shown in FIG. 5D, the peak of the impurity concentration of the semiconductor region RP1 may exist between the semiconductor region RN2 and the semiconductor region RN0. Further, as shown in FIG. 5D, let D be a distance from the semiconductor region RN2 to the semiconductor region RN0 in the Z direction, and let d be a distance from the semiconductor region RN2 to the depth of a peak position of the impurity concentration of the semiconductor region RN1. In this case, a value obtained by dividing the distance d by the distance D may fall within a range of 0.25 to 0.75 ($0.25 \leq d/D \leq 0.75$). A peak position of the impurity concentration of the semiconductor region RP1 may fall within the same range. For example, the peak positions of the impurity concentrations of the semiconductor region RN1 and the semiconductor region RP1 may exist in a central 50% region out of a region obtained by dividing a region between the semiconductor region RN2 and the semiconductor region RN0 into quarters. Furthermore, as shown in FIG. 5D, the peak positions of the impurity concentrations of the semiconductor region RN1 and the semiconductor region RP1 may be almost the same. Almost the same range refers to a depth range in which the peak of the impurity concentration of the semiconductor region RP1 becomes an impurity concentration of 40% or more of the impurity concentration in the peak of the semiconductor region RN1. This means that it is about projected dispersion as a statistical variation in a projected range in ion implantation. The peak positions of the impurity concentrations may be different between the semiconductor region RN1 and the semiconductor region RP1 within the above-described range. For example, when arsenic As is used as a dopant which forms the semiconductor region RN1, and boron B is used as a dopant which forms the semiconductor region RP1, the peak of the impurity concentration of arsenic As is positioned at shallower place than that of boron B when they are implanted with the same ion implantation energy. This is because the projected range of arsenic As is shorter than that of boron B in silicon Si. It is possible, by causing arsenic As to have higher ion implantation energy than boron B, to bring the peak positions of the impurity concentrations closer to each other. In addition, arsenic As has a smaller diffusion coefficient in silicon Si than boron B. Therefore, the moving amount of the peak position becomes small in annealing of the subsequent step. The ion implantation energy may be adjusted in consideration of this point as well.

In the photodiode PD_P, the semiconductor region RN1 of the same conductivity type as that of the semiconductor region RN0 and the higher impurity concentration than that of the semiconductor region RN0 is arranged to form the potential barrier, making the depth of the photodiode PD_P clearer. This makes it possible to suppress the sensitivity difference between the photodiode PD_N and the photodiode PD_P and the influence of the ambient light when recombining the carriers, and to improve the accuracy of distance measurement.

Each of the semiconductor regions RN1, RN2, RP1, RP2, RP3, and the like can be formed by using, for example, ion implantation or solid phase diffusion. The peak positions of the impurity concentrations of the semiconductor region RN1 and the semiconductor region RP1 can be adjusted by appropriately selecting, for example, the type of ion used for ion implantation, implantation energy, an implantation amount, or the temperature or time of activation annealing when the respective semiconductor regions are formed.

Figure 6A:
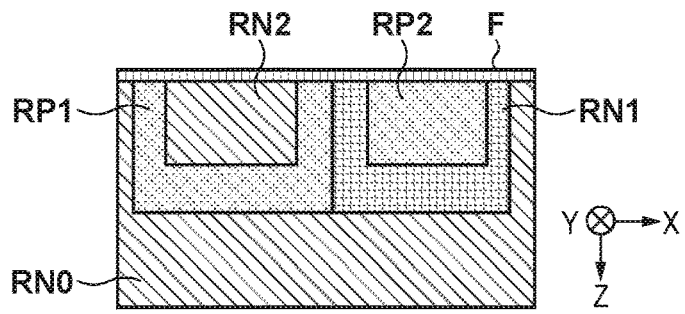
FIGS. 6A to 6D are views each showing a modification of the structure in FIG. 5D.

The arrangement and the structure in the semiconductor region RN0 of the semiconductor region RN1 and the semiconductor region RP1 are not limited to the arrangement shown in FIG. 5D. FIGS. 6A to 6D are sectional views each showing an example of the arrangement of the semiconductor region RN1 and the semiconductor region RP1 in an X-Z direction. In the arrangement shown in FIG. 5D, an n-type semiconductor region having the lower impurity concentration than the semiconductor region RN1 is positioned between the semiconductor region RP1 to be the outer edge of the photodiode PD_N and the semiconductor region RN1 to be the outer edge of the photodiode PD_P. For example, a part of the semiconductor region RN0 may extend between the semiconductor region RP1 and the semiconductor region RN1. That is, not only the bottoms but also the side surfaces of the semiconductor region RP1 and the semiconductor region RN1 may be covered with the semiconductor region RN0. Accordingly, the photodiode PD_N and the photodiode PD_P are arranged apart from each other. As shown in FIG. 6A, however, the semiconductor region RP1 of the photodiode PD_N and the semiconductor region RN1 of the photodiode PD_P may be in contact with each other.

Figure 6B:
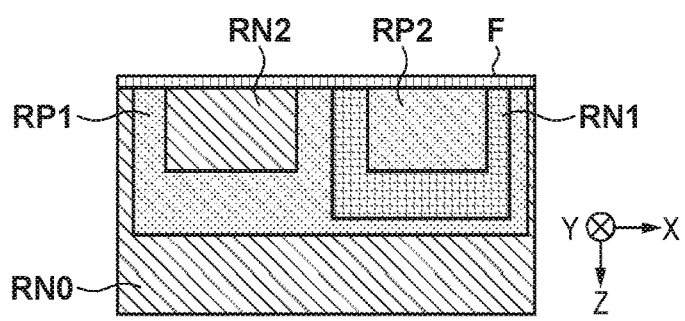

A p-type semiconductor region may be positioned between the n-type semiconductor region RN1 and the n-type semiconductor region RN0. The p-type semiconductor region may be provided separately from the semiconductor region RP1 or, for example, the semiconductor region RP1 may extend successively from under the semiconductor region RN2 to under the semiconductor region RN1 as shown in FIG. 6B. In this case, the semiconductor region RP1 is positioned between the semiconductor region RN0 and at least the bottom of the semiconductor region RN1. The semiconductor region RN0 and the semiconductor region RN1 are electrically insulated from each other by arranging the p-type semiconductor region between the n-type semiconductor region RN0 and semiconductor region RN1. This makes it possible to prevent the carrier moving from the deep position of the semiconductor region RN0 from flowing into the semiconductor region RP2 of the photodiode PD_P. As shown in FIG. 6B, the entire semiconductor region RN1 may be covered with the semiconductor region RP1. It is possible to prevent the carrier from going around and flowing from the side surfaces of the photodiode PD_P by surrounding the photodiode PD_P with the p-type semiconductor region RP1.

Figure 6C:
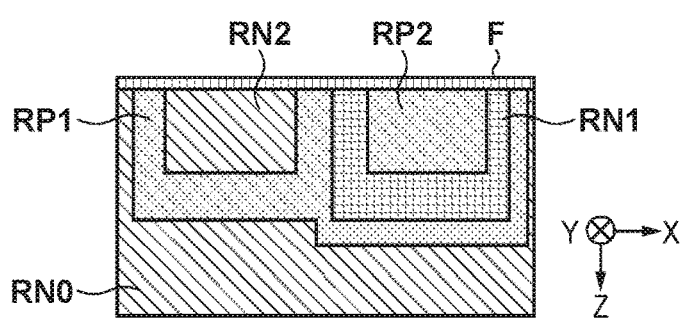

As shown in FIG. 6C, a distance from the upper surface of the semiconductor substrate to the semiconductor region RN0 below the semiconductor region RN2 may be smaller than a distance from the upper surface of the semiconductor substrate to the semiconductor region RN0 below the semiconductor region RP2. In other words, the bottom of the semiconductor region RP1 may be deeper in the Z direction in a portion below the semiconductor region RN1 than a portion below the semiconductor region RN2. In this case, the distance D may be a distance from the semiconductor region RN2 to the semiconductor region RN0 below the semiconductor region RN2. The distance from the upper surface of the semiconductor substrate to the semiconductor region RN0 below the semiconductor region RN2 and the distance from the upper surface of the semiconductor substrate to the semiconductor region RP1 below the semiconductor region RP2 may be different from each other. The distance from the upper surface of the semiconductor substrate to the semiconductor region RN0 below the semiconductor region RN2 may be longer or shorter than the distance from the upper surface of the semiconductor substrate to the semiconductor region RP1 below the semiconductor region RP2. When the semiconductor region RP1 of a shape shown in FIG. 6C is formed, for example, ion implantation may be used twice to form the semiconductor region RP1. First, a mask pattern is formed which has an opening in a region where the bottom of the semiconductor region RP1 on the left side of FIG. 6C is shallow. Ion implantation is performed via this opening, forming the region where the bottom of the semiconductor region RP1 on the left side is shallow. After the mask pattern used to form a shallow region is removed, a mask pattern is formed which has an opening in a region where the bottom of the semiconductor region RP1 on the right side of FIG. 6C is deep. Ion implantation using implantation energy higher than that in forming the shallow region is performed via this opening, forming a region where the bottom of the semiconductor region RP1 on the right side is deep. Then, the arrangement shown in FIG. 6C is formed by forming the semiconductor regions RN1, RN2, and RP2, respectively, by using ion implantation or the like. The type of ion used for ion implantation, implantation energy, an implantation amount, or the temperature or time of activation annealing can be selected appropriately when the respective semiconductor regions are formed. The order of forming the respective semiconductor regions is not limited to the order described above.

The semiconductor region RP1 of the shape shown in FIG. 6C may also be formed by performing ion implantation once. In this case, for example, a mask pattern having a step in a shape in a thickness direction may be used. In a portion where the semiconductor region RP1 is not formed, a mask having a thickness which prevents ions from being implanted into the substrate in ion implantation is formed. In addition, on the region where the bottom of the semiconductor region RP1 on the left side of FIG. 6C is shallow, a mask having a thickness to an extent that ions that have entered in ion implantation penetrate through the mask while losing energy and are implanted into the substrate is formed. That is, for a region in which the semiconductor region RP1 is not formed, the mask pattern is thick. For the region in which the bottom of the semiconductor region RP1 on the left side is shallow, the mask pattern is thinner than that for the region in which the semiconductor region RP1 is not formed. Further, a mask pattern without a mask and with a step is formed for the region in which the bottom of the semiconductor region RP1 on the right side is deep. After the mask pattern is formed, the semiconductor region RP1 having the shape shown in FIG. 6C is formed by performing ion implantation.

Figure 6D:
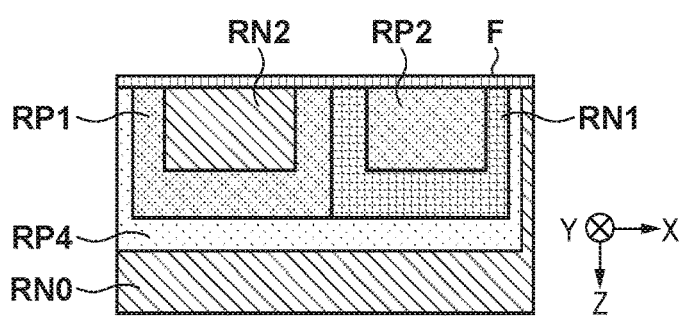

Further, for example, as shown in FIG. 6D, a p-type semiconductor region RP4 may be arranged between the semiconductor region RP1 and the semiconductor region RN0, and between the semiconductor region RN1 and the semiconductor region RN0. The semiconductor region RP4 has a lower impurity concentration than the semiconductor region RP1. In this case, at least the bottoms of the semiconductor region RP1 and the semiconductor region RN1 are covered with the semiconductor region RP4. Further, as shown in FIG. 6D, the semiconductor region RP1 and the semiconductor region RN1 may entirely be covered with the semiconductor region RP4. When the arrangement shown in FIG. 6D is formed, for example, ion implantation may be used twice to form the semiconductor region RP1 and the semiconductor region RP4. First, the semiconductor region RP4 is formed by ion implantation. Then, the semiconductor region RP1 is formed by using implantation energy lower than that in ion implantation to form the semiconductor region RP4 and increasing an implantation amount to form the semiconductor region RP1, making it possible to form the semiconductor region RP1 and the semiconductor region RP4 shown in FIG. 6D.

In FIG. 5D and FIGS. 6A, 6B, and 6D, the distance from the upper surface of the semiconductor substrate to the semiconductor region RN0 below the semiconductor region RN2 and the distance from the upper surface of the semiconductor substrate to the semiconductor region RN0 below the semiconductor region RP2 are almost the same. However, the distance from the upper surface of the semiconductor substrate to the semiconductor region RN0 below the semiconductor region RN2 and the distance from the upper surface of the semiconductor substrate to the semiconductor region RN0 below the semiconductor region RP2 may be different from each other. For example, the semiconductor region RN1 may be formed at the deeper position in the Z direction than the semiconductor region RP1, and the distance from the upper surface of the semiconductor substrate to the semiconductor region RN0 may be longer below the semiconductor region RP2 than below the semiconductor region RN2.

In any arrangement, the peak position of the impurity concentration of each of the semiconductor region RN1 and the semiconductor region RP1 may be positioned at a depth between the semiconductor region RN2 and the semiconductor region RN0 in the depth direction (Z direction). This makes it possible to suppress the sensitivity difference between the photodiode PD_N and the photodiode PD_P and the influence of the ambient light when recombining the carriers, and to improve the accuracy of distance measurement.

The embodiment according to the present invention has been exemplified above. However, the present invention is not limited to this embodiment as a matter of course, and a change and a combination can be made without departing from the scope of the present invention.

For example, a description has been made in this specification assuming that the conductivity type corresponding to the first conductivity type is the n type, and the conductivity type corresponding to the second conductivity type is the p type. However, the first conductivity type may be the p type, and the second conductivity type may be the n type.

Note that each of the plurality of semiconductor regions which forms the semiconductor device can be referred to as the Nth semiconductor region (N≥1) as needed. The semiconductor region to which the semiconductor region referred to as the Nth semiconductor region corresponds is understood rationally within a range that can be grasped from the correspondence relationship between the drawings and description above. The semiconductor regions formed at the same time in a manufacturing process can be regarded as the different semiconductor regions or the same semiconductor region depending on their positions or functions. The semiconductor regions formed separately in the manufacturing process can also be regarded as the different semiconductor regions or the same semiconductor region depending on their positions or functions.

In this specification, the information processing system 100 as an application example of the present invention has been exemplified as the distance measurement system. However, the present invention can also be used for another application purpose as a matter of course and is not limited to the mode exemplified here. For example, the information processing system 100 as the application example of the present invention may be a camera or an information device having a shooting function. The present invention may also be applied to, for example, a human sensor or an obstacle sensor that can be mounted on a car or the like, or may also be applied to, for example, a game player which implements a virtual space. Further, for example, the present invention may also be applied to, without being limited to a structure for performing distance measurement based on the TOF method, a structure for adjusting a focus position based on a phase-difference detection method.

In addition, individual words described in this specification are merely used for the purpose of describing the present invention. The present invention is not limited to the strict senses of those words as a matter of course, and can include their equivalents.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2016-011882, filed Jan. 25, 2016, which is hereby incorporated by reference wherein in its entirety.

What is claimed is:

1. A semiconductor device comprising a first photodiode and a second photodiode arranged in a semiconductor substrate, and
wherein a detection unit which includes the first photodiode and the second photodiode is configured to generate a signal based on both a first carrier which is one of electrons and holes generated in the first photodiode, and a second carrier which is the other of electrons and holes generated in the second photodiode,
wherein the first photodiode and the second photodiode are arranged at different positions in a first direction along an upper surface of the semiconductor substrate, and
assuming that a semiconductor region in which the first carrier is a majority carrier and the second carrier is a minority carrier is of a first conductivity type, and a semiconductor region in which the second carrier is a majority carrier and the first carrier is a minority carrier is of a second conductivity type,
the first photodiode includes a first semiconductor region of the second conductivity type, and a second semiconductor region of the first conductivity type arranged between the upper surface and the first semiconductor region in a second direction perpendicular to the upper surface,
the second photodiode includes a third semiconductor region of the first conductivity type, and a fourth semiconductor region of the second conductivity type arranged between the upper surface and the third semiconductor region in the second direction,
a fifth semiconductor region of the first conductivity type is provided at a position farther apart from the upper surface than the first semiconductor region,
in the second direction, a peak of an impurity concentration of the third semiconductor region is positioned in a depth range equivalent to a depth range where the first semiconductor region, between the second semiconductor region and the fifth semiconductor region, exists and
the impurity concentration of the third semiconductor region is higher than an impurity concentration of the fifth semiconductor region.

2. The device according to claim 1, wherein the fifth semiconductor region extends under the fourth semiconductor region in the first direction, and
the third semiconductor region is positioned between the fourth semiconductor region and the fifth semiconductor region.

3. The device according to claim 2, wherein a semiconductor region of the second conductivity type is positioned between the third semiconductor region and the fifth semiconductor region.

4. The device according to claim 1, wherein in the first direction, a semiconductor region of the first conductivity type lower than the third semiconductor region in impurity concentration is positioned between the first semiconductor region and the third semiconductor region.

5. The device according to claim 1, wherein the first semiconductor region and the third semiconductor region contact each other.

6. The device according to claim 1, wherein a semiconductor region of the second conductivity type is positioned between the third semiconductor region and the fifth semiconductor region, and wherein a semiconductor region of the first conductivity type is arranged between the first semiconductor region and the fifth semiconductor region, and between the third semiconductor region and the fifth semiconductor region.

7. The device according to claim 1, wherein the first conductivity type is a p type, and the second conductivity type is an n type.

8. The device according to claim 1, wherein the semiconductor device includes a plurality of detection units each comprising the detection unit.

9. The device according to claim 1, wherein the detection unit further includes
a first potential supply unit configured to supply a first potential to the first semiconductor region, and
a second potential supply unit configured to supply a second potential to the third semiconductor region, and
the first potential and the second potential are different from each other.

10. The device according to claim 9, wherein in the second direction, a peak of an impurity concentration of the first semiconductor region is positioned in a depth range having an impurity concentration of not less than 40% of the impurity concentration of the third semiconductor region in the peak.

11. The device according to claim 9, wherein in the second direction, letting D be a distance from the second semiconductor region to the fifth semiconductor region, and d be a distance from the second semiconductor region to a depth of a position of the peak of the impurity concentration of the third semiconductor region, $0.25 \leq d/D \leq 0.75$ is satisfied.

12. The device according to claim 9, wherein a distance from the upper surface to the fifth semiconductor region below the second semiconductor region is smaller than a distance from the upper surface to the fifth semiconductor region below the fourth semiconductor region.

13. The device according to claim 9, wherein the first conductivity type is an n type, and the second conductivity type is a p type.

14. The device according to claim 9, wherein a ground potential is between the first potential and the second potential.

15. A semiconductor device comprising a first photodiode and a second photodiode arranged in a semiconductor substrate, and
wherein a detection unit which includes the first photodiode and the second photodiode is configured to generate a signal based on both a first carrier which is one of electrons and holes generated in the first photodiode, and a second carrier which is the other of electrons and holes generated in the second photodiode,
wherein the first photodiode and the second photodiode are arranged at different positions in a first direction along an upper surface of the semiconductor substrate, and
assuming that a semiconductor region in which the first carrier is a majority carrier and the second carrier is a minority carrier is of a first conductivity type, and a semiconductor region in which the second carrier is a majority carrier and the first carrier is a minority carrier is of a second conductivity type, the first photodiode includes a first semiconductor region of the second conductivity type, and a second semiconductor region of the first conductivity type arranged between the upper surface and the first semiconductor region in a second direction perpendicular to the upper surface, the second photodiode includes a third semiconductor region of the first conductivity type, and a fourth semiconductor region of the second conductivity type arranged between the upper surface and the third semiconductor region in the second direction, a fifth semiconductor region of the first conductivity type is provided at a position farther apart from the upper surface than the first semiconductor region, and in the second direction, a peak of an impurity concentration of the third semiconductor region is positioned in a depth range corresponding to a depth range where the first semiconductor region, between the second semiconductor region and the fifth semiconductor region, exists, wherein the detection unit further includes a sixth semiconductor region of the first conductivity type, a first transfer unit configured to transfer the first carrier from the second semiconductor region to the sixth semiconductor region, a seventh semiconductor region of the second conductivity type, a second transfer unit configured to transfer the second carrier from the fourth semiconductor region to the seventh semiconductor region, and a detection node electrically connected to the sixth semiconductor region and the seventh semiconductor region in common, and the semiconductor device generates the signal based on a potential of the detection node.

16. The device according to claim 15, wherein the detection unit alternately performs transfer of the first carrier by the first transfer unit and transfer of the second carrier by the second transfer unit.

17. The device according to claim 15, wherein the detection unit further includes an eighth semiconductor region of the first conductivity type, a third transfer unit configured to transfer the first carrier from the second semiconductor region to the eighth semiconductor region, a ninth semiconductor region of the second conductivity type, and a fourth transfer unit configured to transfer the second carrier from the fourth semiconductor region to the ninth semiconductor region.

18. The device according to claim 17, wherein the detection unit alternately performs transfer of the first carrier by the first transfer unit and transfer of the first carrier by the third transfer unit, and alternately performs transfer of the second carrier by the second transfer unit and transfer of the second carrier by the fourth transfer unit.

19. An information processing system comprising:

a semiconductor device; and a processing unit configured to process a signal output from the semiconductor device, wherein the semiconductor device comprises a first photodiode and a second photodiode arranged in a semiconductor substrate, and a detection unit which includes the first photodiode and the second photodiode is configured to generate a signal based on both a first carrier which is one of electrons and holes generated in the first photodiode, and a second carrier which is the other of electrons and holes generated in the second photodiode, wherein the first photodiode and the second photodiode are arranged at different positions in a first direction along an upper surface of the semiconductor substrate, and assuming that a semiconductor region in which the first carrier is a majority carrier and the second carrier is a minority carrier is of a first conductivity type, and a semiconductor region in which the second carrier is a majority carrier and the first carrier is a minority carrier is of a second conductivity type, the first photodiode includes a first semiconductor region of the second conductivity type, and a second semiconductor region of the first conductivity type arranged between the upper surface and the first semiconductor region in a second direction perpendicular to the upper surface, the second photodiode includes a third semiconductor region of the first conductivity type, and a fourth semiconductor region of the second conductivity type arranged between the upper surface and the third semiconductor region in the second direction, a fifth semiconductor region of the first conductivity type is provided at a position farther apart from the upper surface than the first semiconductor region, in the second direction, a peak of an impurity concentration of the third semiconductor region is positioned in a depth range equivalent to a depth range where the first semiconductor region, between the second semiconductor region and the fifth semiconductor region, exists, and the detection unit further includes;

a first potential supply unit configured to supply a first potential to the first semiconductor region, and a second potential supply unit configured to supply a second potential to the third semiconductor region, and the first potential and the second potential are different from each other.

20. The information processing system according to claim 19, wherein the impurity concentration of the third semiconductor region is higher than an impurity concentration of the fifth semiconductor region.

* * * * *